United States Patent [19]

Togei et al.

[11] 4,330,849
[45] May 18, 1982

[54] COMPLEMENTARY SEMICONDUCTOR MEMORY DEVICE

[75] Inventors: Ryoiku Togei, Machida; Yoshihiko Hika, Yokohama, both of Japan

[73] Assignee: Fujitsu Limited, Kawasaki, Japan

[21] Appl. No.: 180,805

[22] Filed: Aug. 27, 1980

Related U.S. Application Data

[63] Continuation of Ser. No. 960,435, Nov. 13, 1978, abandoned.

[30] Foreign Application Priority Data

Nov. 17, 1977 [JP] Japan .................................. 52-138217

[51] Int. Cl.³ ............................................. G11C 11/40
[52] U.S. Cl. ....................................... 365/181; 357/24
[58] Field of Search ........................ 365/181, 182, 186; 357/24; 307/238, 304, 313

[56] References Cited

U.S. PATENT DOCUMENTS

| | | | |
|---|---|---|---|
| 3,841,926 | 10/1974 | Garnache et al. | 365/182 |
| 3,919,569 | 11/1975 | Gaensslen et al. | 365/181 |
| 3,968,479 | 7/1976 | Goser | 365/181 |
| 3,971,055 | 7/1976 | Arai | 365/182 |
| 3,974,486 | 8/1976 | Curtis et al. | 365/182 |

*Primary Examiner*—Stuart N. Hecker
*Attorney, Agent, or Firm*—Staas & Halsey

[57] ABSTRACT

Disclosed herein is a semiconductor memory device comprising a semiconductor substrate having a first conductivity type, first and second regions of a second conductivity type opposite to said first type formed in the surface of the semiconductor substrate and separated with a certain space therebetween, a third region of the first conductivity type formed in the second region, and a gate electrode formed on an insulating film on the semiconductor substrate between the first and the third regions. By applying a gate voltage to the gate electrode, charge carriers are transferred between the first and second regions in accordance with the data to be stored. The stored data is read out by applying a prescribed gate voltage to the gate electrode and by detecting the value of the current between the third region and the semiconductor substrate.

2 Claims, 10 Drawing Figures

COMPLEMENTARY SEMICONDUCTOR MEMORY DEVICE

This is a continuation of application Ser. No. 960,435, filed Nov. 13, 1978, now abandoned.

BACKGROUND OF THE INVENTION

This invention relates to a semiconductor memory device and more particularly to a semiconductor memory device utilizing a Metal-Insulator-Semiconductor (MIS) configuration.

In the prior art, a static type MIS memory for data storage is well known, wherein charge may be stored in the stray capacitance of a gate electrode of an MIS transistor. An MIS memory cell comprising even three or four MIS transistors generally has a simple configuration and requires less elements than a comparable device comprising bipolar transistors. The MIS memory cell occupies less area and accordingly higher integration density per chip can be obtained. However, the above MIS memory cell having three of four MIS transistors still occupies a considerably large area.

In view of the foregoing, a one transistor/cell type memory device has previously been developed. In the one transistor/cell type memory device, each memory cell is simply composed of one MIS transistor and one capacitor, and thus each memory cell occupies a small area. However, the above one transistor/cell type memory device has the following disadvantages. The reading of data is performed by detecting the rather small charge stored in the capacitor, which requires a sophisticated sense amplifier and complicated read-out procedures.

SUMMARY OF THE INVENTION

An object of the present invention is to provide a semiconductor memory device which requires an area equal to or smaller than the one transistor/cell type memory device.

Another object of the present invention is to provide a semiconductor memory device which ensures easy data reading and writing operations.

A further object of the present invention is to provide a semiconductor memory device in which the reading of data is performed by detecting the value of a current into or out of a semiconductor substrate.

A semiconductor memory device according to the present invention comprises a semiconductor substrate having a first conductivity type, first and second regions of a second conductivity type opposite to said first type formed in the surface of the semiconductor substrate and separated with a certain space therebetween, a third region of said first conductivity type formed in the second region, a gate electrode formed over an insulating film on the semiconductor substrate between the first and third regions, means for storing data in the second region by controlling the transfer of charge carriers between the first and second regions, and means for reading the stored data by applying a prescribed gate voltage to the gate electrode and detecting a current between the third region and the semiconductor substrate.

In the memory cell, an MIS transistor with a channel of the second conductivity type comprises the first and second regions, and another MIS transistor with a channel of the first conductivity type comprises the third region and the semiconductor substrate, both of the transistors sharing the same gate electrode. The second region is floated, having at most a contact to an electrode for refreshing memory.

When writing data, the MIS transistor with the channel of the second conductivity type is turned on, so that the data is stored in the second opposite conductivity type region.

When reading stored data, current including null current flows between the third region and the semiconductor substrate in accordance with the potential variation resulting from the stored charge.

Additional objects and features of the present invention will appear from the following description in which the preferred embodiments of the invention have been set forth in detail in conjunction with the drawings.

DESCRIPTION OF THE PREFERRED EMBODIMENTS

Figure 1:
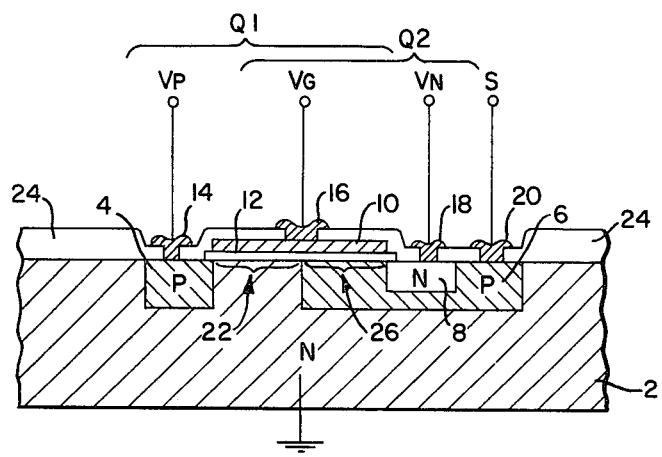
FIG. 1 shows a cross-sectional view of a semiconductor memory device in accordance with an embodiment of the present invention.
Figure 2:
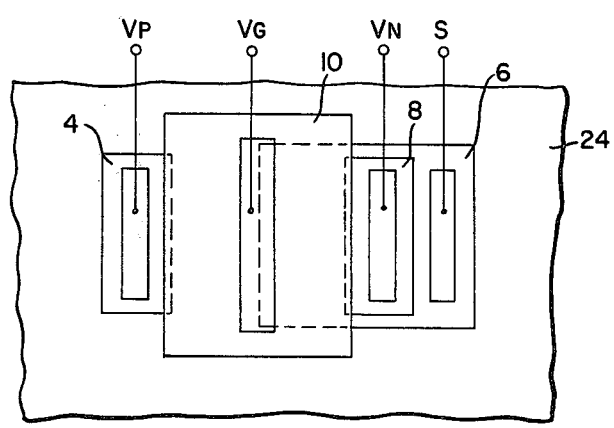
FIG. 2 shows a plan view of the semiconductor memory device shown in FIG. 1.

FIG. 1 shows a cross-sectional view of a semiconductor memory device in accordance with an embodiment of the present invention and FIG. 2 shows a plan view of the semiconductor memory device shown in FIG. 1.

These figures show an N type silicon semiconductor substrate 2, P type regions 4, 6 formed in the surface of the semiconductor substrate 2 with a certain space therebetween, an N type region 8 formed in the P type region 6, a gate electrode 10 comprising, for example, aluminum or conductive polycrystalline silicon covering at least a part 26 of the P type region 6 and a part 22 of the semiconductor substrate 2, a gate insulating film 12 comprising silicon dioxide ($SiO_2$) formed between the semiconductor substrate 2 and the gate electrode 10, an electrode 14 extending from the P type region 4, an electrode 16 extending from the gate electrod 10, an electrode 18 extending from the N type region 8, an electrode 20 extending from the P type region 6, a silicon dioxide film 24, and terminals $V_P$, $V_G$, $V_N$ and S of the electrodes 14, 16, 18 and 20, respectively. (In the following, $V_P$, $V_G$ and $V_N$ also represent voltages applied to the respective terminals, for convenience.)

In this configuration, a P channel type MIS transistor $Q_1$ is formed by the P type regions 4 and 6, the gate electrode 10 and the gate oxide film 12, and an N channel type MIS transistor $Q_2$ is formed by the N type silicon semiconductor substrate 2, the N type region 8, the gate electrode 10 and the gate oxide film 12.

In the portion 22 of the semiconductor substrate 2, a channel of P type conductivity associated with the MIS transistor $Q_1$ is formed upon application of a negative voltage to the gate 10, whereas in the portion 26 of the P type region 6, a channel of N type conductivity is formed in the MIS transistor $Q_2$ upon application of a positive voltage to the gate 10. The electrode 20 connected to the terminal S is optionally formed for refreshing the memory by means of an external refreshing circuit as desired.

Figure 3:
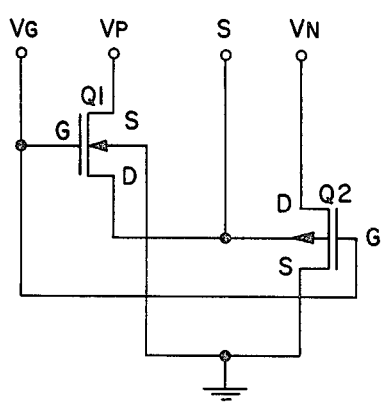
FIG. 3 shows an equivalent circuit of a semiconductor memory device in accordance with the present invention.

FIG. 3 shows an equivalent circuit of the semiconductor device exemplified in FIGS. 1 and 2. An example of operating the memory cell of the present invention is now explained in the case of the embodiment shown in FIGS. 1 through 3. It is preferable, first of all, that a negative voltage be applied to the terminal S extending from the electrode 20 before starting write and read-out operations, so that the P type region 6 is placed initially in a lower potential state. Thereafter, the terminal S is opened.

When writing data into the memory cell, a gate voltage $V_G$, which is more negative than the threshold voltage of the P channel type transistor $Q_1$, is applied to the gate electrode, so that charge carriers may be transferred into the P type region 6 from the P type region 4, depending upon the data to be written.

When writing the data "1" into the memory cell, a positive voltage $V_P$ is applied through the electrode 14, while the gate voltage $V_G$ is maintained at the negative voltage, so that the transistor $Q_1$ is turned on. Thereby, holes flow into the P type region 6 from the P type region 4, passing through the channel formed in the portion 22. However, since the P type region 6 is in a floating condition, the injected holes are stored in the P type region 6.

The accumulation of holes results in variation of the potential of the P type region 6 to produce effectively a forward bias of the P-N junctions at the perimeter of region 6. Thereby, the data "1" is stored in the P type region 6.

When reading the data stored in the memory cell, such as reading a "1" stored as described above, a positive (or negative, as explained in the second following sentence) voltage $V_N$ is applied to the electrode 18, while the gate voltage $V_G$ is held at a prescribed positive constant value. The prescribed positive constant value of $V_G$ is selected such that when it is applied, the transistor $Q_2$ is in the on state when the potential of the P type region 6 is increased by the presence of holes in the P type region 6 (the state in which "1" is stored) and is in the off state otherwise. Thereby, a current must flow into the N type semiconductor substrate 2 from the N type region 8 (or in the inverse direction if $V_N$ is negative) via the channel formed in the portion 26 of the P type region 6. This current does not affect the stored charge, and thus the stored information is not disturbed.

However, since holes have been injected into the P type region 6, the threshold voltage $V_{thN}$ of the N channel type MIS transistor $Q_2$ has decreased in accordance with the amount of holes injected as mentioned above. Thus, the current that flows between the semiconductor substrate 2 and the N type region 6 depends on whether the holes were injected into the P type region 6.

Moreover, if the gate voltage $V_G$ is lower than the threshold voltage $V_{thN}$, the channel is not formed in the portion 26 of the P type region 6, and thereby the N channel type MIS transistor $Q_2$ does not turn on. This condition is sensed by detecting the current flowing in the electrode 18.

Next is explained the writing of a "0" into the memory cell, and, again, a negative voltage may be applied to the terminal S at first so that any data stored in the P type region 6 is erased. Then, the negative gate voltage $V_G$ is applied as above and the voltage $V_P$ is maintained at a value lower than or equal to the potential of the P type region 6. Since $V_P$ equal to or lower than the voltage of the P type region 6, even though a channel is formed in the portion 22, therefore hole injection does not occur into the P type region 6 from the P type region 4. Thereby, the data "0" is written in the P type region 6.

For a "0" stored in the P type region 6, a positive (or negative) voltage $V_N$ is applied to the electrode 18 and thereafter the gate voltage $V_G$ is held at the same positive constant value as described above, which is lower than the threshold voltage $V_{thN}$ of the N channel type MIS transistor $Q_2$. Since holes have not been injected into the P type region 6, the channel is not formed in the portion 26 and thus current is not observed between the N type semiconductor substrate 2 and the N type region 8, or the current is sufficiently smaller than that in the case when a "1" is writeen in the P type region 6. This condition is also sensed by detecting the zero or small current flowing in the electrode 18, so that thereby a "0" stored in the memory cell can be read out.

In the present invention it should be understood that the input data can also correspond to the voltage $V_P$, with a set of appropriate voltages applied to the other terminals. Also for writing data, holes can be transferred into the P type region 4 from the P type region 6.

Furthermore, the refreshing operation performed through the terminal S, as mentioned above, can also be performed without the terminal S but by utilizing the transistor $Q_1$, whereby the terminal $V_P$ becomes the refreshing terminal sharing the data input terminal.

Figure 4:
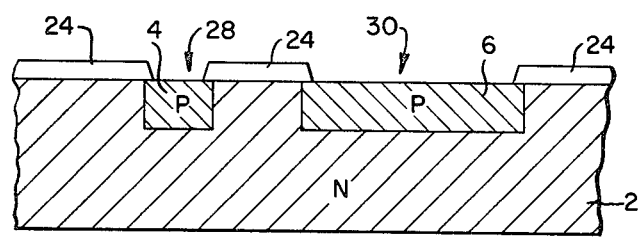
FIGS. 4 to 7 show cross-sectional views of a semiconductor device for explaining a manufacturing process.

An example of a method for manufacturing the memory cell shown in FIG. 1 will be explained with reference to FIGS. 4 to 7, showing in cross-section the steps of manufacturing a memory cell. First, as shown in FIG. 4, a silicon dioxide film 24 having a thickness of 5000 to 8000 Å is formed by thermal oxidation on the entire surface of an N type silicon semiconductor substrate 2. The impurity concentration of the N type semiconductor substrate 2 is about $1 \times 10^{17}/cm^3$. The channel cut is doped with an N type impurity as required. The windows 28 and 30 are formed by patterning the silicon dioxide film 24, and P type regions 4 and 6 having thickness from 2 to 3 microns are formed by doping impurities into the semiconductor substrate 2 through the windows 28 and 30 by either a thermal diffusion or ion implantation method. Thus, boron ions (B+) may be implanted into the semiconductor substrate 2 using the silicon dioxide film 24 as a mask. The impurity concentration of the P type regions 4 and 6 ranges from $5 \times 10^{18}$ to $1 \times 10^{19}/cm^3$.

Figure 5:
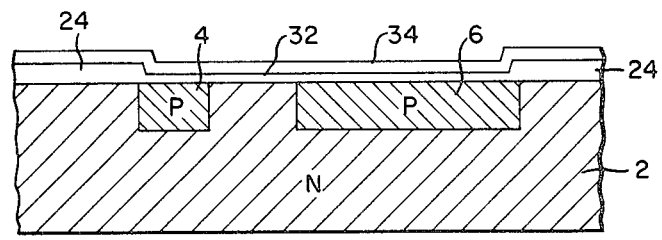

Then, referring to FIG. 5, after removing the silicon dioxide film 24 between the P type regions 4 and 6, a thin silicon dioxide film 32 having thickness from 500 to 1000 Å is formed on the surface of the exposed silicon semiconductor substrate 2 by oxidation, and a polycrystalline silicon film 34 having a thickness of 5000 to 1000 Å is coated on the entire surface of the device by chemical vapor deposition.

Figure 6:
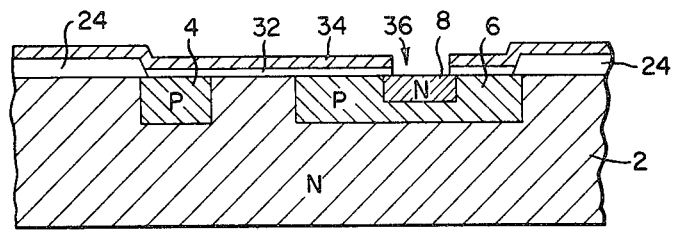

Then, referring to FIG. 6, after opening a window 36 by patterning the polycrystalline silicon film 34 and the thin silicon dioxide film 32, an N type region 8 having thickness of about 1 micron is formed by an ion implantation method in the P type region 6. At this time, the N type impurity is implanted also into the polycrystalline silicon film 34 to make it conductive. Such conductivity can also be given to the polycrystalline silicon film 34 when it is formed in the abovementioned process.

Figure 7:
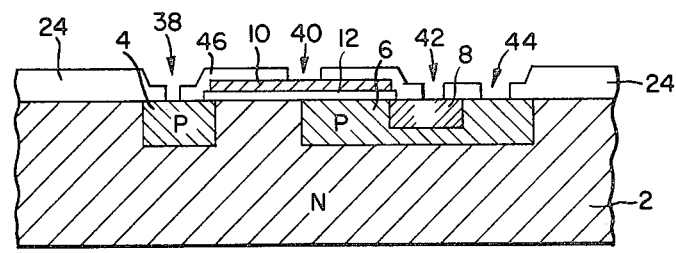

Then, referring to FIG. 7, the polycrystalline silicon film 34 is subjected to selective etching to form a gate electrode 10. Then, a silicon dioxide film 46 is coated on the entire surface of the device by chemical vapor deposition, although it can also be made by thermal oxidation. Then electrode windows 38, 40, 42 and 44 are formed by patterning the silicon dioxide film 46.

Finally, aluminum electrodes 14, 16 18 and 20 are formed in the electrode windows 38, 40, 42 and 44, respectively, as shown in FIG. 1 to complete the memory.

In the embodiment shown in FIGS. 1 to 3, the terminal S is for the purpose of performing a refresh operation using a known outside clocking circuit. However, as mentioned above, the refresh operation can also be performed through the terminal $V_P$ which also works as a data input terminal, and in this case the terminal S is unnecessary.

Figure 8:
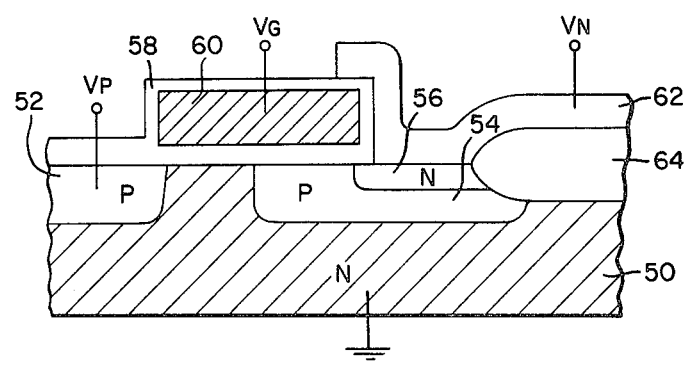
FIG. 8 shows a cross-sectional view of a semiconductor device in accordance with another embodiment of the present invention.

FIG. 8 shows a cross-sectional view of a memory cell according to another embodiment of the present invention in which the terminal S shown in FIGS. 1 to 3 is omitted. The figure shows an N type silicon semiconductor substrate 50, P type regions 52 and 54 formed in the surface region of the semiconductor substrate 50 with a certain space therebetween, an N type region 56 formed in the P type region 54, a gate electrode 60 comprising conductive polycrystalline silicon, an electrode 62 comprising aluminum or conductive polycrystalline silicon, silicon dioxide films 58 and 64 and terminals $V_P$, $V_G$ and $V_N$ connected to the P type region 52, the gate electrode 60 and the electrode 62, respectively.

In manufacturing the memory device shown in FIG. 8, a silicon nitride film is deposited on an N type silicon semiconductor substrate 50 which is coated with a thin silicon dioxide film on the surface by a conventional chemical vapor deposition method. Then, after patterning the silicon nitride film by means of photolithography, a thermal oxidation treatment is performed on the semiconductor substrate 50 using the silicon nitride film as a mask, and thereby the field silicon oxide film 64 is formed. The thermal oxidation is adjusted so that the thickness of the field oxide film 64 becomes about 8000 to 10,000 Å.

After removing the silicon nitride film and the underlying thin silicon dioxide film by an etching method, the P type regions 52 and 54 having a thickness of about 1 micron are formed by implanting boron ions (B+) into the semiconductor substrate 50 using, for example, a photoresist as a mask. Then, thermal oxidation is performed again to the semiconductor substrate 50 to form a thin silicon dioxide film. A conductive polycrystalline silicon film 60 is deposited on the entire surface of the device by chemical vapor deposition, selectively patterned to form the gate electrode, and oxidized to a thickness of about 1000 to 2000 Å.

After opening a window through the thin silicon dioxide film in the portion where the N tye region is to be formed, the second polycrystalline silicon film 62 is deposited and selectively patterned, and an N type impurity is diffused through the second polycrystalline silicon film into the N type region 56 having a thickness of about 0.3 micron in the P type region 54 between the field silicon dioxide film 64 and the gate electrode 60. Then the aluminum wiring layer corresponding to the terminals $V_P$, $V_G$ and $V_N$ is formed by a conventional method after appropriate contact holes and regions are made to complete the memory cell.

In this embodiment, it is apparent that the N type region 56 between the field silicon oxide film 64 and the gate electrode 60 can be made by a self-alignment technique.

It should also be noted that further variations of process steps are equally available to produce a memory cell having the functions of the present invention, such as is realized in a cell with typical configuration as shown in FIG. 8.

Figure 9:
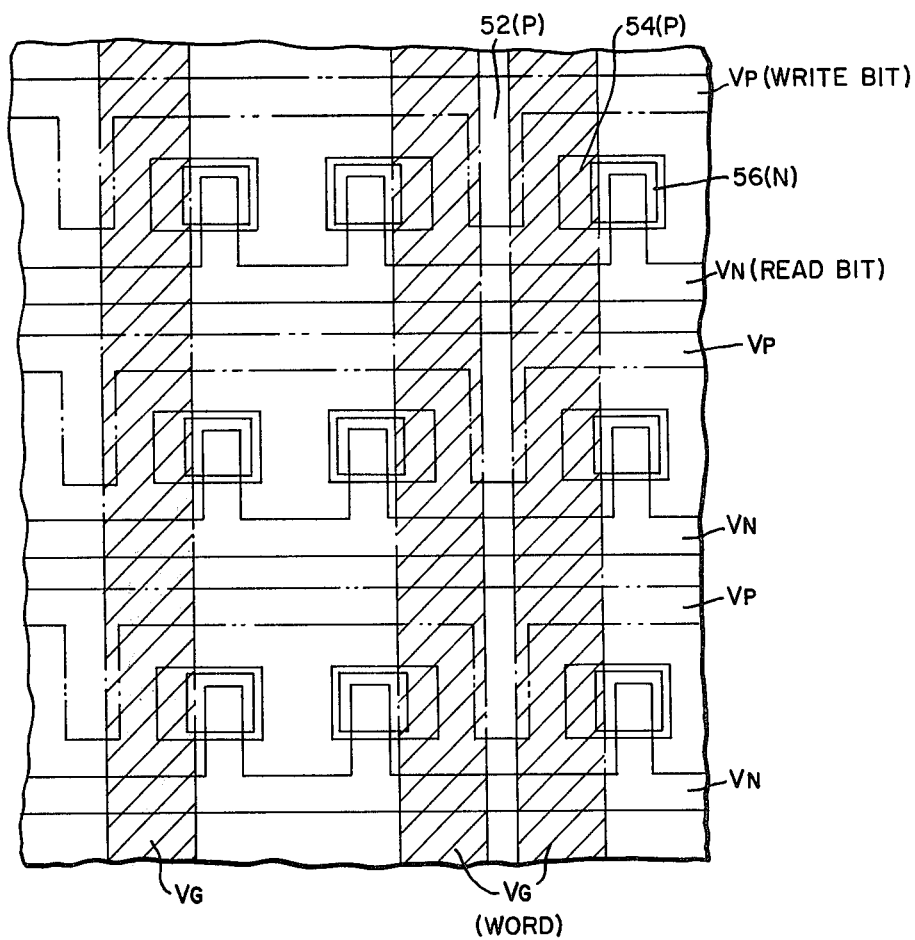
FIG. 9 shows an example of layout of the semiconductor memory device shown in FIG. 8.

FIG. 9 shows an example of a layout of the memory device employing the memory cell configuration of FIG. 8. Word lines are formed by the lines $V_G$ which serve as the gate electrodes 60, write bit lines are formed by the lines $V_P$ which serve as the P type regions 52, and read bit lines are formed by the lines $V_N$ which serve as the elctrodes 62. These lines $V_G$, $V_P$ and $V_N$ form or are connected to the respective terminals indicated above.

Figure 10:
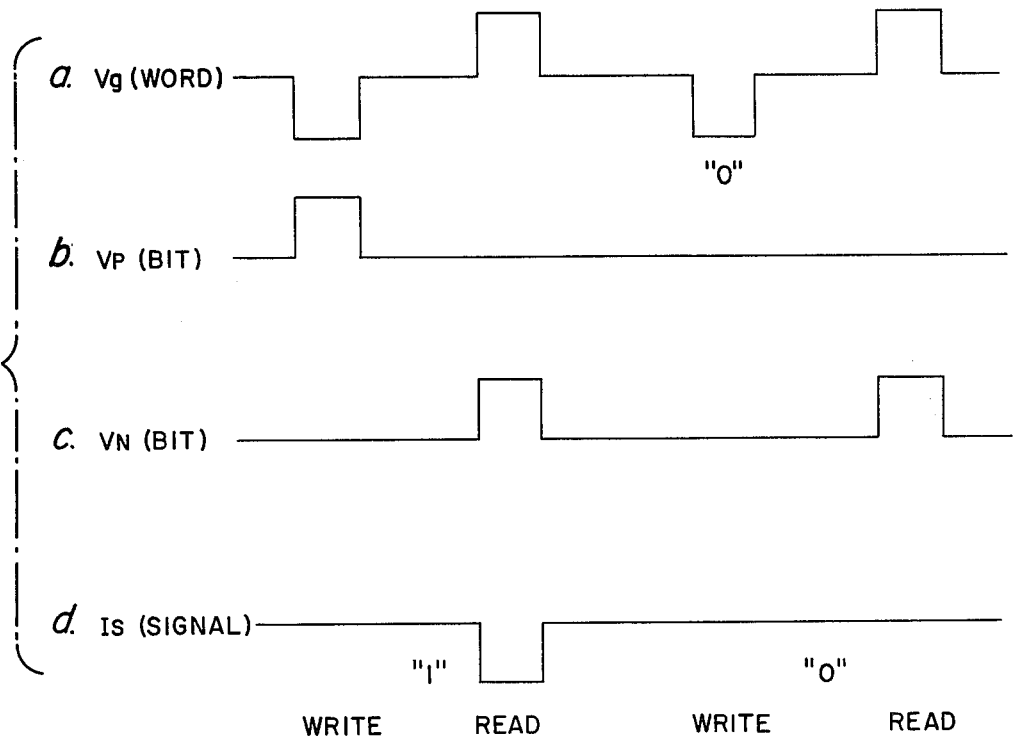
FIG. 10, including a–d, shows an illustration for explaining the operation of the semiconductor memory device shown in FIGS. 8 and 9.

FIG. 10 shows an illustration for explaining the operation of the memory device shown in FIGS. 8 and 9. When writing a "1" into a memory cell, a positive pulse voltage, for example +5 V set to correspond to the input "1", is supplied to one of the bit lines $V_P$ and at the same time a negative pulse voltage, for example −5 V which is more negative than the threshold voltage $V_{thP}$ of the P channel type MIS transistor $Q_1$, is applied to one of the word lines $V_G$. Thereby, holes flow into the P type region 54 from the P type region 52. Thereby, a "1" is stored in the P type region 54.

When reading data stored as a "1", a positive pulse voltage, for example +5 V, is applied to the selected bit line $V_N$ and at the same time a positive pulse voltage, for example, +5 V, is applied to the selected word line $V_G$. Since holes have been injected into the P type region 54, the threshold voltage of the N channel type MIS transistor $Q_2$ has changed to $V_{thN}$, which is lower than the $V_{thN}$ for the case where no holes are injected. In this embodiment, the threshold voltage $V_{thN}$, is lower than +5 V, and accordingly the N channel type MIS transistor $Q_2$ is turned on. Therefore, current flows between the region 56 and the semiconductor substrate 50. This condition is sensed by detecting the current flowing in the bit line $V_N$ (electrode 62) by means of a known current detector connected to the bit line $V_N$. The detected signal corresponding to the current is shown as $I_S$ in FIG. 10(d).

When writing a "0" into a memory cell, a null voltage corresponding to the input "0" is supplied to one of the bit lines $V_P$ and at the same time a negative pulse voltage, for example, −5 V, which is more negative than the threshold voltage $V_{thP}$ of the P channel type MIS transistor $Q_1$, is applied to one of the word lines $V_G$. In this case, the P channel type MIS transistor $Q_1$ does not turn on. Thereby, a "0" is written into the P type region 54.

When reading this stored "0", the same signals as that for reading a "1" is applied to the selected word line $V_G$ and the line $V_N$. In this case, the N channel type MIS transistor $Q_2$ does not turn on, and no current flows into the semiconductor substrate 50 from the N type region 56. Therefore, no current is detected by the current detector which is connected to the bit line $V_N$ as shown in FIG. 10(d).

As described above, according to the present invention, a semiconductor memory device is provided which occupies an area equal to or smaller than that of the known one transistor/cell type memory device. Thereby, high integration density of the semiconductor memory device can be realized.

Moreover, according to the present invention, data writing into the memory cell can be realized very easily and the data can be read out more easily than that of the known one transistor/cell type memory device, since a highly sensitive sense amplifier is not required for reading the data signal having a current mode.

It will be apparent that many modifications and variations may be effected without departing from the scope of the novel concepts of the present invention. It is intended by the appended claims to cover such modifications and adaptations which fall within the true spirit and scope of the present invention.

What is claimed is:

1. A memory cell consisting essentially of two complementary metal-insulator-semiconductor (MIS) transistors integrated into a single semiconductor substrate with a single area portion of a single insulated gate serving entirely as the gates of said two MIS transistors, each said cell further consisting of:

a semiconductor substrate having a first conductivity type, said substrate comprising the channel region of the first of said two MIS transistors, first and second spaced regions of conductivity type opposite to that of said substrate, said first and second spaced regions and the intervening portion of said substrate corresponding to the first of said two MIS transistors, a third region of the conductivity type of said substrate formed in said second region, said substrate and said second and third regions corresponding to the second of said two MIS transistors, a gate insulating layer and a gate electrode forming said single gate, and extending between said first and third regions, a field oxide layer extending into said substrate and having a configuration surrounding said third region except on the side of said third region on which said single gate is formed, said second and third regions both abutting at least in part horizontally with said first oxide along respective portions of the border of said field oxide around said cell, and no other portion of said field oxide being in contact with said third region, said single gate electrode with said single gate area portion extending in a single solid pattern on the gate insulating layer from said first region to said third region, said gate electrode having a configuration corresponding to self-alignment with respect to said first and second regions to extend at least to some extent over said first and third regions, said third region having a configuration corresponding to self-alignment with said respective portion of the border of said field oxide and said gate insulating layer, and said third size being of a minimum region for accommodating a single electrode contact thereto, necessary corresponding electrodes for activating each of said first and third regions and for grounding said substrate, said second region being floating electrically, for changing the threshold voltage of said second MIS transistor as a result of charges transferred by said first MIS transistor and stored in said second region.

2. The memory cell of claim 1, said field oxide having thickness in the range from 8000 to 10,000 Å, said first and second regions having a thickness in the range from 2 to 3 microns and an impurity concentration of said opposite conductivity type in the range from $5 \times 10^{18}$ to $1 \times 10^{19}/cm^3$, and said third region having a thickness of approximately 1 micron.

* * * * *

UNITED STATES PATENT AND TRADEMARK OFFICE
CERTIFICATE OF CORRECTION

PATENT NO. : 4,330,849
DATED : 18 May 1982
INVENTOR(S) : TOGEI et al

It is certified that error appears in the above-identified patent and that said Letters Patent are hereby corrected as shown below:

Col. 4, line 9, after "$V_p$" should read --is--.

Col. 8, line 23, "size" should be --region--;

line 24, "region" should be --size--.

Signed and Sealed this

Thirtieth Day of November 1982

[SEAL]

Attest:

GERALD J. MOSSINGHOFF

*Attesting Officer*     *Commissioner of Patents and Trademarks*